United States Patent [19]

Speed, III et al.

[11] Patent Number: 5,751,168
[45] Date of Patent: May 12, 1998

[54] BUS SWITCH INTEGRATED CIRCUIT WITH VOLTAGE TRANSLATION

[75] Inventors: Harold H. Speed, III, McKinney; James C. Spurlin, Sherman, both of Tex.

[73] Assignee: Texas Instruments Incorporated, Dallas, Tex.

[21] Appl. No.: 431,162

[22] Filed: Apr. 28, 1995

[51] Int. Cl.$^6$ ............... H03K 19/0175; H03K 19/094
[52] U.S. Cl. .................... 326/83; 326/86; 326/68
[58] Field of Search ........................ 326/83, 86, 68, 326/62, 63; 257/471, 357, 654; 327/108, 427

[56] References Cited

U.S. PATENT DOCUMENTS

| | | | |
|---|---|---|---|
| 4,626,882 | 12/1986 | Cottrell et al. | 257/357 |
| 5,122,691 | 6/1992 | Balakrishnan | 326/86 |
| 5,184,198 | 2/1993 | Bartur | 257/471 |
| 5,376,846 | 12/1994 | Houston | 326/68 |
| 5,408,147 | 4/1995 | Yarbrough et al. | 326/68 |
| 5,414,375 | 5/1995 | Tsuboi | 326/30 |
| 5,442,304 | 8/1995 | Wong et al. | 326/17 |
| 5,502,329 | 3/1996 | Pezzani | 257/654 |

*Primary Examiner*—Edward P. Westin
*Assistant Examiner*—Richard Roseen
*Attorney, Agent, or Firm*—Warren L. Franz; Mark E. Courtney; Richard L. Donaldson

[57] ABSTRACT

A circuit and method for providing a bus switch that translates voltage from one level to a second, lower level. A FET bus switch transistor 310 is integrated on the same silicon chip 320 with one or more diodes 330 in series with Vcc, the power supply 340. A bias current source 350 is included to bias the diode. The diodes and current source are configured to provide additional voltage translation so that when a control input couples the input pin at the source of the FET bus switch to the output pin at the drain of the FET bus switch, the voltage at the output pin can be placed at a predetermined level. The bus switch thus acts as both a bus coupling device and a voltage translation device.

17 Claims, 3 Drawing Sheets

BUS SWITCH INTEGRATED CIRCUIT WITH VOLTAGE TRANSLATION

FIELD OF THE INVENTION

This invention relates generally to the field of integrated circuits and the coupling of signals to busses and systems, and specifically to the use of voltage translation circuitry in conjunction with bus coupling circuits to couple signals of different voltage levels to busses and systems.

BACKGROUND OF THE INVENTION

When designing and building electronic systems, it is often desirable to connect two signals or busses with a switch. The switch is used to couple the signals together when desired, and to selectively isolate the signals when desired. In this way, many devices or circuits may be coupled to a signal bus without conflicts. Control lines are used to determine when a particular switch device should couple its input signals to the bus, which is coupled to the output of the switch. These switches provide a bidirectional capability. Also, multiple switches may be incorporated onto a single integrated circuit and share a control signal, such as for data busses and other multiple bit busses. In the prior art, these CMOS FET transistor bus switches are often used instead of traditional buffers and transceivers to directly connect two busses of an electronic system. The CMOS FET switches act as fast transition, low resistance, high current capacity, bidirectional, solid-state relays.

FIG. 1 depicts a prior art bus switch integrated circuit, and for simplicity only a single switch transistor is shown. The FET switch is typically implemented as a large N-channel CMOS transistor 110, the drain 120 and source 130 being coupled to input/output pins of the integrated circuit, and the gate 140 connected to a gate control 150 for receiving a switch control signal from the control input pin. The gate control signal 150 may be as simple as a direct connection to the device input pin, or may be derived from a logic circuit 160. In either case, the control signal is connected to the highest voltage level available, typically Vcc, to turn on the switch in response to a voltage at the control signal input pin.

A basic property of an N-channel MOS FET transistor is that the thru-resistance, that is the impedance seen from the drain 120 to source 130, depends on Vgs, the gate to source voltage. The transistor 110 is off if Vgs is less than Vt, the threshold voltage. For increasing Vgs, the thru-resistance of the switch 110 decreases. If the gate voltage is held constant at Vcc, as would be the case for an enabled bus switch of FIG. 1, the thru-resistance then becomes a function of the input/output voltages. If the input pin (drain input of transistor 110) is then driven low to a low voltage level, typically about 0V, the output (source output of transistor 110) follows it to 0V. This condition results in very low thru-resistance since the gate to source voltage Vgs is maximized. If the input pin is then subsequently driven high to Vcc, the output pin follows it also. However, in this case, the voltage Vgs is smaller. The output from the source of transistor 110 does not rise to the full Vcc level because then Vgs would be zero, and the switch transistor would turn off. Instead, the output voltage rises to an equilibrium point approximately one diode drop or transistor threshold voltage (about 1V) less than the supply voltage Vcc. This property can be exploited to provide voltage translation from the input to the output, and from one bus to another.

As system designs transition from TTL level voltages to lower level voltage components, there is a need to provide voltage translation between the two voltage levels. Currently the voltage level translation required is from a 5V high level to a 3.3V high level voltage. As battery powered applications expand, and the technology available improves, translation from 5V high levels to lower voltages, perhaps 2V high level voltages, will be required.

FIG. 2 depicts a standard prior art solution for providing voltage translation. Integrated circuit 260 is the same as integrated circuit 170 in FIG. 1. The standard bus transistor switch 210, with its 1V switching threshold, will translate a 5V signal at the input pin 220 down to about 4V at the output pin 230. However, this output voltage is still too high to drive an I/O port of a 3.3V device, since it will forward bias a parasitic diode within the receiving device and possibly damage the 3.3V device.

To solve this problem, system designers using prior art techniques have added a discrete diode 240 in series with the Vcc pin 250 of the bus switch integrated circuit 260. The diode 240 drops the gate voltage input of the FET switch 210 by approximately 0.7V, providing additional voltage translation to bring the bus switch output voltage 230 down to a safe level for the 3.3V device. In some cases, the designer will also need to add a resistor 270 from the cathode of the diode to ground. This resistor is necessary to provide an additional bias current through the diode 240 if the supply current Icc of the bus switch logic integrated circuit 260 is not a sufficient current to develop an adequate voltage drop across the diode 240. These extra components add cost to the system and require valuable board space. The use of these external components also adds complexity to the board assembly process, requires additional testing to ensure proper operation, and because there are more solder connections and components, reduces the mean time between failure (MTBF) and overall reliability of the boards so designed. Because the diodes and the FET switch are discrete, there is a thermal compensation problem due to the fact that the two circuits are on separate pieces of silicon and therefore experience different ambient temperatures, especially under high current situations. There is thus a need for an improved circuit and method for providing voltage translation when using bus switch devices to couple busses of different voltage levels.

SUMMARY OF THE INVENTION

A circuit and method for providing voltage translation between signals and busses having different voltage levels is described. In a first embodiment, a diode and resistor are fabricated on the same integrated circuit as the bus switch FET and its associated control circuitry. This integrated circuit provides the system designer with the required level of voltage translation for high voltage to lower voltage level systems without the need for external diodes and resistors. This integrated circuit saves board space and component costs. In one embodiment, the resistor is implemented as a small N-channel transistor, and the diode is implemented as two Schottky diodes in series. A second embodiment places the diode in an arrangement where the internal circuitry remains at a full Vcc supply level, but the output device, typically an inverter, is coupled through the diode to provide the voltage translation. A third embodiment is described wherein the internal voltage drop circuitry is a voltage regulator circuit instead of a diode or series diode tree.

BRIEF DESCRIPTION OF THE DRAWINGS

Corresponding numerals are used for corresponding elements in the drawings, unless otherwise indicated in the text.

DETAILED DESCRIPTION OF PREFERRED EMBODIMENTS

Figure 3:
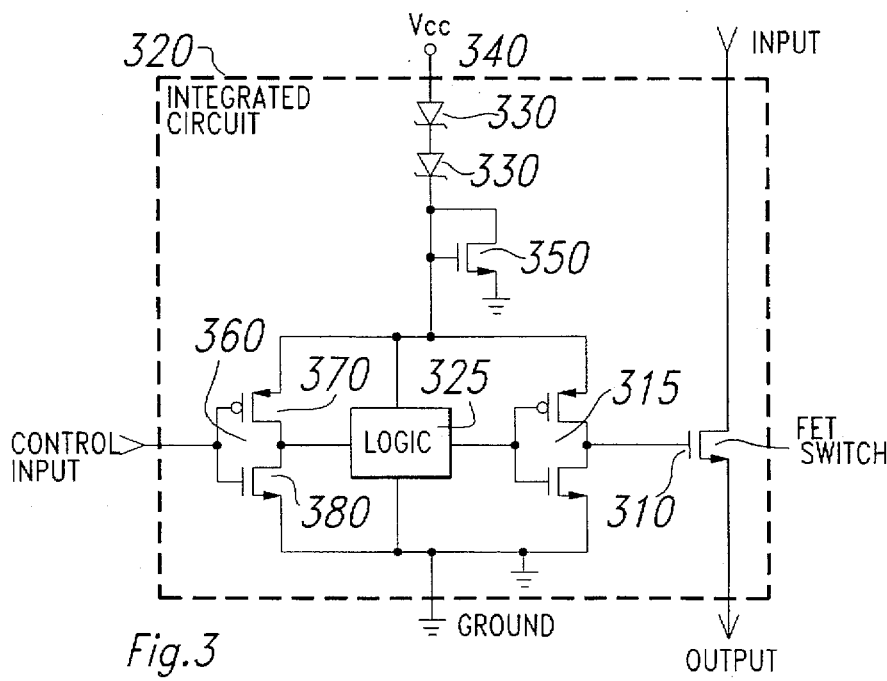
FIG. 3 depicts a schematic of a first embodiment of a bus switch integrated circuit incorporating the invention.

FIG. 3 depicts a first preferred embodiment of an integrated circuit bus switch circuit 320 which incorporates the voltage translation circuitry of the invention. Diodes 330 and CMOS transistor 350 provide the diode voltage drop and bias resistor needed to achieve the voltage regulation at the gate input of FET switch transistor 310. Control input inverter 360 comprises transistors 370 and 380 which receive the control pin input. Logic block 325 is an optional circuit which can be included to provide more sophisticated control of the second inverter stage 315. The gate of FET switch 310 is therefore coupled to the control input pin through two inverter stages and thus tracks the voltage at the control input pin.

In operation, the diode chain of serial diodes 330 provides the voltage drop required to lower the gate voltage of transistor 310. When a high voltage is provided at the gate of transistor 310, it will be about 0.7 volts below Vcc. As described above, when the transistor 310 is on, the source voltage will always rise to a maximum voltage of about 1 volt below the gate voltage so that the Vgs voltage will exceed the threshold voltage for the device. Thus the maximum voltage at the output will be about 3.3V for a 5 volt supply voltage. This means that even though the input voltage at the drain terminal of transistor 310 is at 5 volts, the output voltage will be at a maximum of 3.3V, thus the bus switch integrated circuit 320 acts as a voltage translating bus switch. When the gate of transistor 310 is high and the source input terminal of the device is at a low voltage, the drain terminal will track it all the way to the same low voltage, so on the low voltage side no translation is required. When the control input pin is at a low voltage, the gate of transistor 310 is at a voltage below the threshold, so the source and drain terminals of transistor 310 are decoupled. In this case the output pin of integrated circuit 320 floats and the voltage at the output pin is determined by other devices coupled in parallel to the bus.

CMOS transistor 350 is used as an efficient replacement for the resistor of the prior art. Like the resistor, CMOS transistor 350 is coupled between the output of the series diodes 330 and ground to provide sufficient current through the diodes to make sure the required voltage drop occurs. Because the transistor 350 is diode connected, it is always on and the Rdson impedance of the device will provide the necessary resistor. The device may be increased or decreased in size to provide the correct resistance value, as is well known in the art.

CMOS transistor 350 is needed in some applications to provide a bias current through the diodes 330 sufficient to ensure the proper voltage drop occurs through the diode chain. In some applications where sufficient current Icc is flowing through the rest of the logic, this added bias current may not be necessary. Note also that although a transistor is used here, resistors such as polysilicon or metallic resistors could be used. A current source circuit could be used to provide the bias current. Other techniques well known in the art for providing bias current could also be used as alternatives to transistor 350.

Although the embodiment of FIG. 3 is described herein as typically translating a high input voltage level of 5V to a 3.3V output voltage level, the use of the invention and the benefit is readily extended to any situation where the output voltage level must be lower than the input voltage being coupled to it; and the number of diodes 330 can be varied to provide translation to a lower voltage, also the supply and/or input voltage can be 3.3V and output voltage lower still, for example, as required by the particular environment or system.

Figure 1:
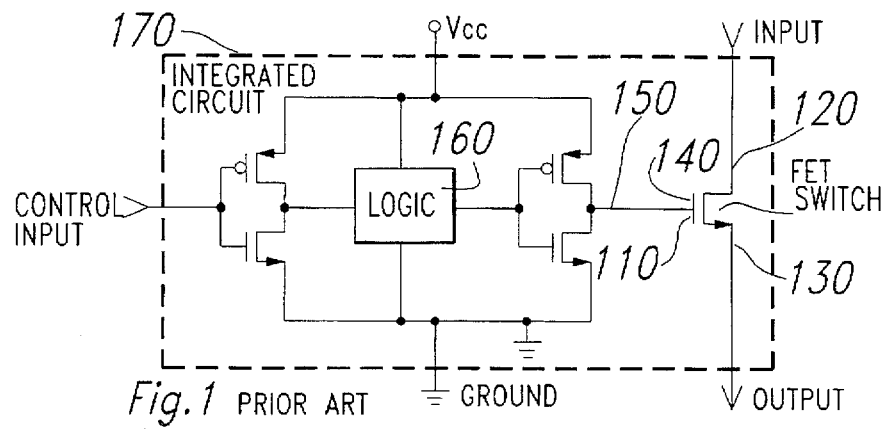
FIG. 1 (prior art) is a prior art schematic of a bus switch integrated circuit with control circuitry.
Figure 2:
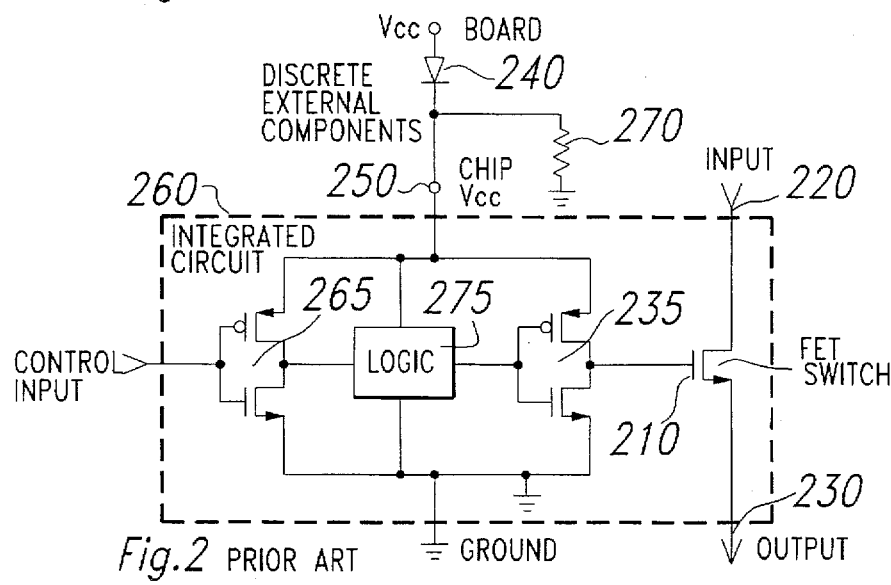
FIG. 2 (prior art) is a prior art schematic of a bus switch integrated circuit with external circuitry to provide a voltage translation at the output of the bus switch.

The embodiment of FIG. 3 has several advantages over the prior art solution of FIG. 2. For example, the circuitry of FIG. 3 has a self compensating property for thermal compensation. The threshold voltage of the N-channel FET switch 310 has a positive temperature coefficient, whereas that of the diodes 330 is negative. These devices therefore tend to offset each other in response to thermal changes. This results in less variation of output voltage over temperature as contrasted with the standard FET bus switch without the diode. The compensation provided by the present embodiment is also better than the discrete solution of the prior art. The embodiment of FIG. 3 places all of the components on a single piece of silicon, and therefore all of the components have the same operating temperature, since the integrated diode 330 are at the same temperature as the FET switch 310. In the prior art circuit as shown in FIG. 2, by contrast, the discrete diode is placed outside the integrated circuit package, thermal coupling to the FET switch is not as efficient, and no compensation takes place.

The circuit of FIG. 3 is further designed to address another problem which occurs in the prior art. With the external diode solution of FIG. 2, the diode lowers the input threshold and therefore the noise margin of the control circuitry of the integrated circuit bus switch by dropping the power supply voltage at the input inverter coupled to the control line. The inputs are typically designed with TTL compatible thresholds. Addition of the diode will cause the high input threshold to shift down a few hundred millivolts. This makes the device more sensitive to voltage transients on the control inputs, possibly causing false switching of the bus switches, or increased noise sensitivity, also called lowered noise immunity.

In contrast, the present embodiment of this invention as shown in FIG. 3 includes a modified control input threshold which compensates for the diode drop, and thus retains the normal TTL input threshold. The modification is implemented using a standard technique of changing the input inverter 360 P-channel transistor 370 to N-channel transistor 380 gate-width ratio. By compensating for the diode drop of the supply to this inverter 360, the full TTL input threshold level is maintained at the control input pin.

Figure 4:
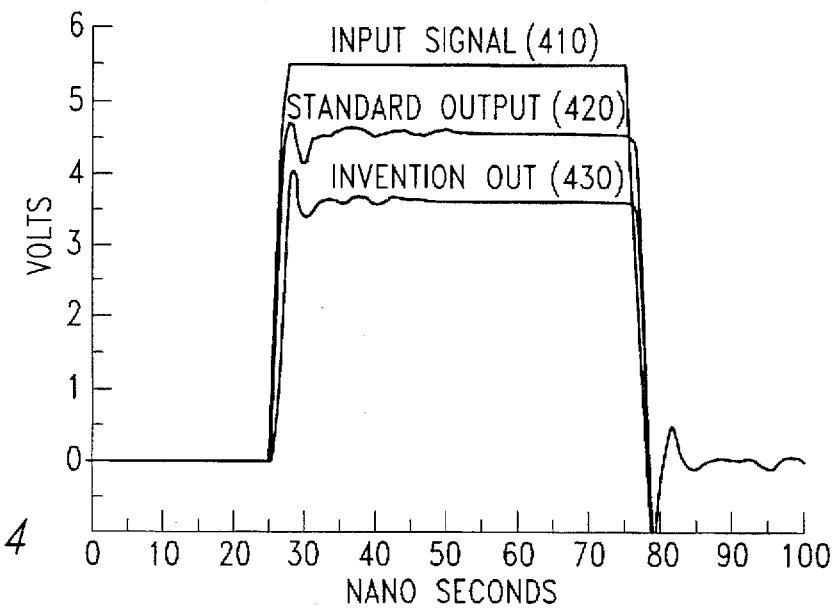
FIG. 4 is a plot of the input output voltage characteristics of a prior art arrangement as shown in FIG. 2, and of the circuit incorporating the invention as shown in FIG. 3.

FIG. 4 plots electrical simulation results comparing the standard FET bus switch voltage output with the voltage output obtained using the present embodiment of the invention. In FIG. 4, the input signal is plotted as line 410 and is switched from 0V to 5.5V. The output swing of the standard switch is plotted as line 420 and the swing is 0V to 4.5V, which is too high to drive a 3.3V component without causing damage. The output swing of the circuit of the invention is plotted as line 430 and swings 0V to 3.6V, which is an acceptable drive signal for a 3.3V component.

Figure 5:
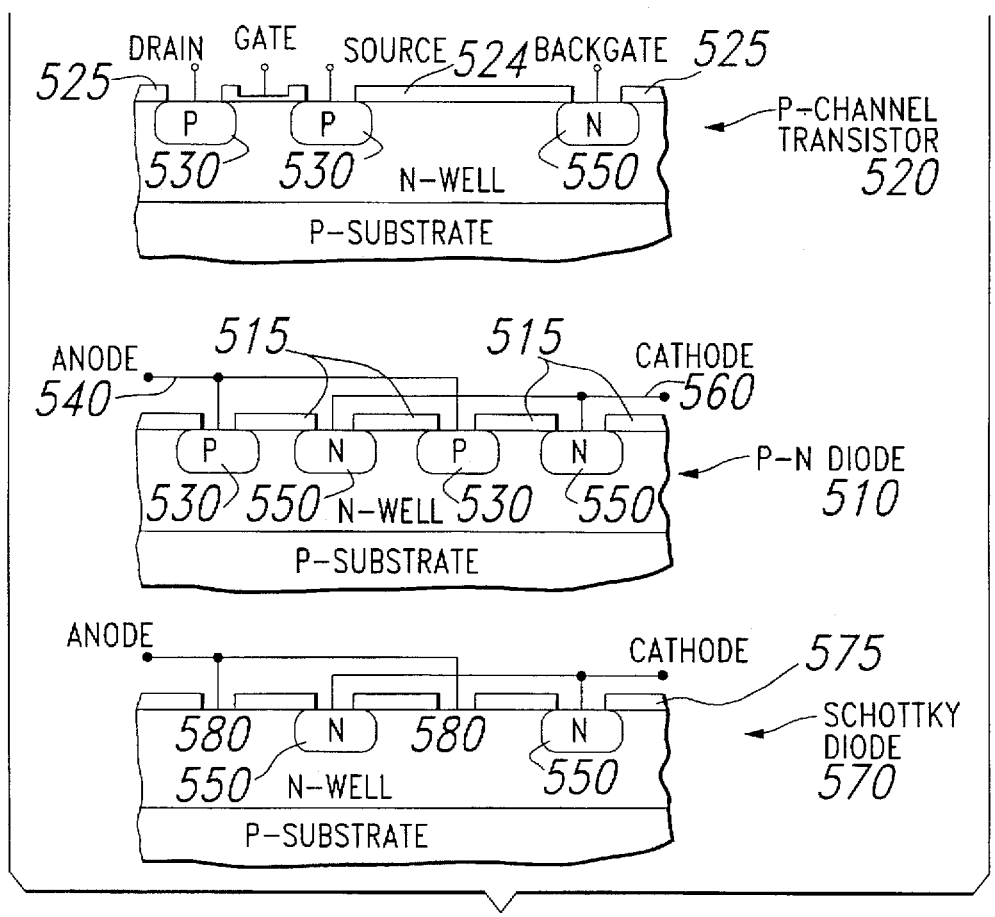
FIG. 5 depicts cross sectional views of the physical construction of the diodes which can be used in the embodiment of FIG. 3.

The circuit depicted in FIG. 3 requires that diodes be constructed that are compatible with CMOS processes. FIG. 5 shows a simplified cross section of the diode construction on a silicon wafer. Metallization regions are not shown for simplicity. With a P-substrate N-well CMOS process, a P-N diode 510 may be constructed similarly to a P-channel transistor 520. In P-channel transistor 520, oxide 525 is formed over an N-well region using standard processing steps. Backgate contacting region 550 is used to provide a contact area for the backgate metal, which is not shown. Gate, drain and source regions are formed using conventional processing techniques. The source and drain regions 530 are doped areas which are diffused into the N-well. When a voltage in excess of the cut off threshold voltage is applied at the gate terminal, a channel will form between the gate and drain and the two regions will be electrically coupled by the gate region.

A diode may be formed using the regions available in a CMOS process for providing the P-channel transistor 520. The P-channel source/drain P-type regions 530 become the anode regions 540 of the diode, while the N-type well connection vias 550 become the cathode 560. Oxide 515 is used to isolate the N-Well from overlying layers of metallization, which are not shown. Multiple stripes of anode and cathode material are used for high current density. However, this structure has a disadvantage. A parasitic bipolar PNP transistor exists, formed by the P-type source/drain regions 530 (emitter), N-type well (base) and P-type substrate (collector). If the beta of this parasitic PNP transistor is high enough, it will shunt current from Vcc to ground, greatly increasing the integrated circuit supply current Icc. For applications requiring only a small diode bias current, this may not be a problem. However, the present embodiment of FIG. 3 uses an alternate Schottky diode construction 570 which results in a Schottky junction 580 instead of a P-N junction. In this construction, P-type regions 530 of the P-N diode 510 are masked out, no doping and diffusion steps are done in these areas. Instead the metal anode busses contact the N-well directly, resulting in a rectifying junction 580 at the metal/N-well interface. A Schottky diode also has a parasitic PNP transistor, but its beta is much lower, so current flow is reduced from Vcc to ground. Depending on the metal system used in the integrated circuit, it may be necessary to use more than one Schottky diode 570 in series to obtain the required voltage drop for the particular process.

Figure 6:
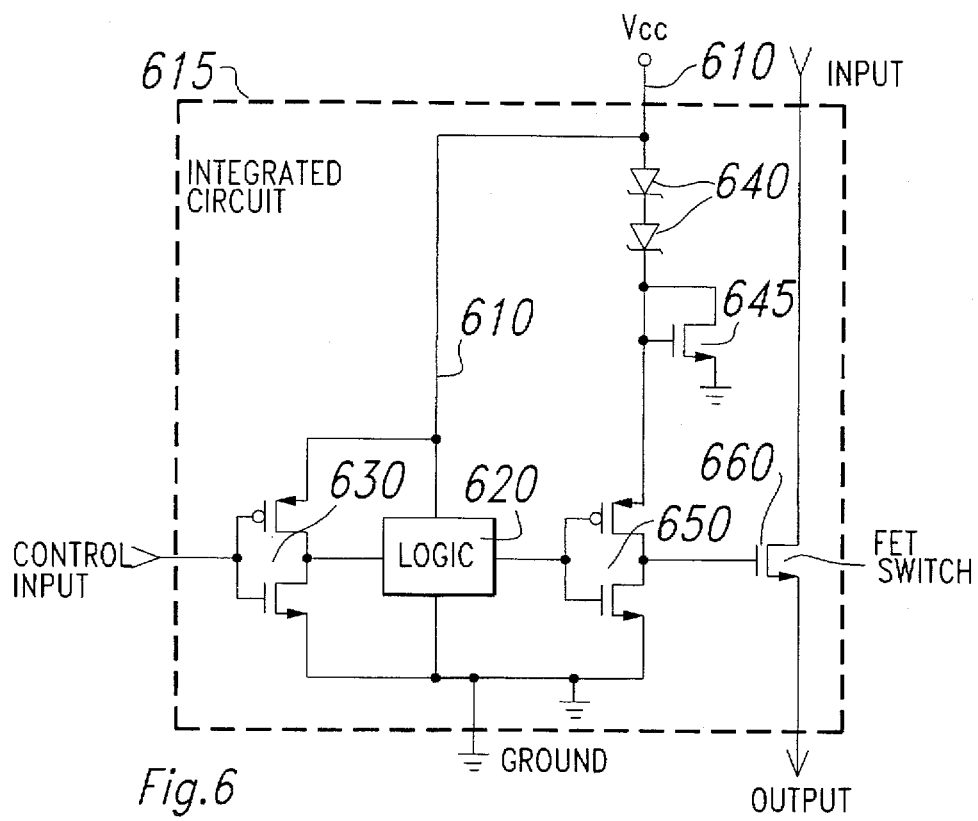
FIG. 6 depicts a schematic of a second circuit embodiment of the invention having a faster transition time.

FIG. 6 depicts an alternate embodiment of the bus switch integrated circuit of FIG. 3 incorporating the invention. In FIG. 6, integrated circuit 615 comprises diodes 640 in series with each other. Transistor 645 acts as a bias resistor and couples the lowered voltage output of the diodes to ground to provide a bias current through the diodes. Inverter 630, logic 620 and inverter 650 are coupled as before between the control input pin and the gate of FET switch 660. The input signal pin is coupled to the drain of FET switch 660 and the output pin to the source of FET switch 660.

In operation, the integrated circuit 615 operates functionally in the same manner as the integrated circuit 310 of the previous embodiment. However, addition of the diode or diodes 640 in series with the power supply voltage Vcc will slow down the propagation delay of the gate control circuitry from the control input pin to the gate terminal of transistor 660, as compared to the standard no-diode device of the prior art. This is due to the decreased power supply voltage available to the circuitry of inverters 630 and logic circuitry 620. The arrangement of FIG. 6 addresses this problem. In FIG. 6, the circuit supplies the full Vcc voltage on node 610 to the control circuit logic 620 and input inverter 630, and couples the diode or diodes 640 and the resulting dropped voltage supply only at the last stage 650 driving the gate of the FET switch 660. This allows most of the control circuit to operate at the maximum supply voltage Vcc, and thus provides the maximum transition speed in response to a transition at the control input pin. Also no adjustment of the input threshold is necessary, so the inverter 630 can be a standard input inverter. It has been found, however, that the embodiment shown in FIG. 6 requires a higher level of bias current Icc through the diode 640, increasing the Icc of the integrated circuit. This is not a problem in many applications, but in power critical applications additional circuitry may be required to compensate for this effect.

Figure 7:
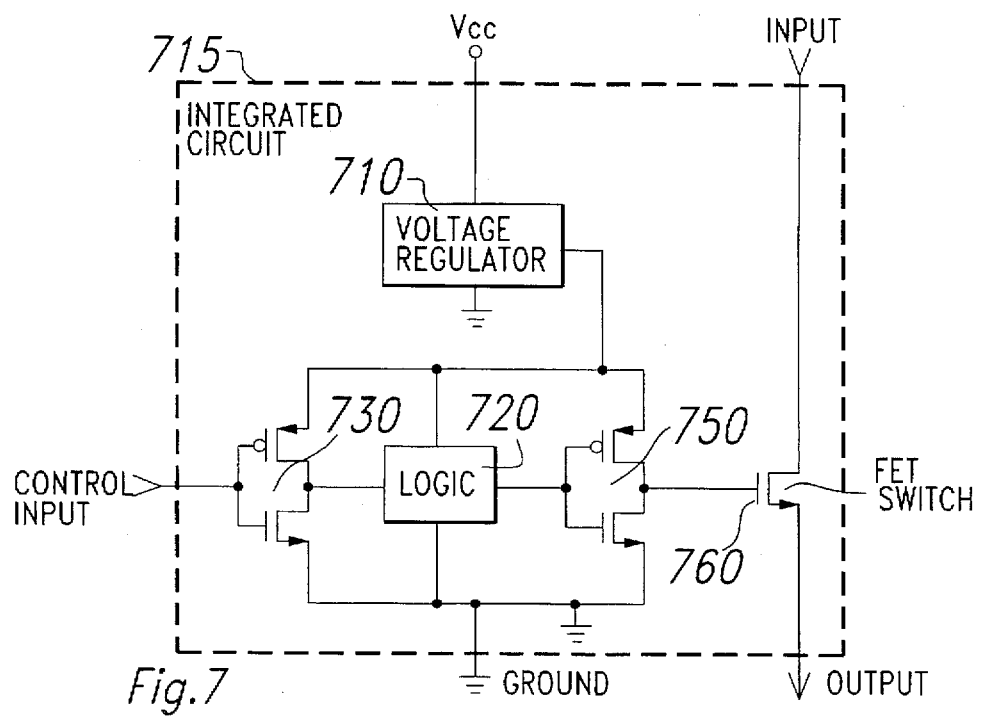
FIG. 7 depicts a schematic of a third circuit embodiment of the invention.

FIG. 7 depicts another embodiment of an integrated circuit bus switch incorporating the invention. In FIG. 7, integrated circuit 715 incorporates voltage regulator 710, and FET switch 760, which has its drain coupled to the input pin and its source coupled to the output pin. The gate of transistor 760 is coupled to the control logic comprising input inverter 730, logic block 720, and gate driving inverter 750. The supply voltage to the gate control circuitry is coupled to the output of voltage regulator 710, which provides the necessary voltage level reduction to the gate of FET 760, and hence the voltage translation at the output.

In operation, the integrated circuit 715 operates functionally in the same manner as the integrated circuits of FIGS. 3 and 6. FIG. 7 illustrates that the concept of voltage translation on the output of a FET switch can be extended to include any type of circuit which translates the internal integrated circuit Vcc level. A voltage regulator 710 can be added on-chip to provide any level of voltage translation desired, with temperature and process compensation designed to meet specific goals. Voltage regulator 710 can be any of a variety of types of voltage regulator circuits suitable for incorporation on board a CMOS integrated circuit, as are well known in the art.

While this invention has been described with reference to illustrative embodiments, this description is not intended to be construed in a limiting sense. For example, although the FET switch devices 310, 660, and 760 are shown having the drain terminals coupled to the input pins of the respective integrated circuits, and sources coupled to the output pins, each can be coupled with the drain as the input terminal and the source as the output as is well known. Although the invention is typically well suited to CMOS processes, other FET transistors may be substituted and the resulting circuit will still obtain the benefit of the use of the invention. Various modifications and combinations of the illustrative embodiments, as well as other embodiments of the invention, will be apparent to persons skilled in the art upon reference to the description. It is therefore intended that this specification and the appended claims encompass any such modifications or embodiments.

What is claimed is:

1. A bus switch integrated circuit with voltage translation, comprising on the same integrated circuit:
   a circuit output terminal;
   a circuit input terminal;

a circuit control input terminal;

a driving transistor coupled between said circuit input terminal and said circuit output terminal to couple said circuit input terminal to said circuit output terminal, responsive to a gate input; and gate control circuitry coupled to said circuit control input terminal and having an output for driving said gate input, said gate control circuitry being coupled to a voltage supply input and operable for providing a first predetermined voltage at said gate input which is less than said voltage supply input voltage; and said gate control circuitry including:

at least one diode having an anode coupled to said voltage supply input and a cathode coupled to an output;

a first inverter stage coupled to said control input terminal, and having an output, said first inverter stage having a voltage supply input coupled to said at least one diode output;

a second inverter stage having an input coupled to said first inverter stage output and having an output coupled to said gate input, said second inverter stage having a voltage supply input coupled to said diode output; and a transistor having a gate terminal and a first current conduction terminal coupled together to said diode output to form a first terminal of a bias resistor, and having a second current conduction terminal coupled to a ground reference to form a second terminal of said resistor;

said at least one diode providing said first predetermined voltage level as the supply to said first and second inverter stages and said control logic circuit, and wherein the output of said second inverter stage is approximately equal to said first predetermined voltage;

wherein said bus switch integrated circuit is operable to receive input signals of a first voltage level at said circuit input terminal and provide output signals of a second voltage level which is a second predetermined voltage lower than said first predetermined voltage at said circuit output terminal.

2. The bus switch integrated circuit of claim 1, wherein said gate control circuitry further comprises a control logic circuit having a voltage supply input coupled to said diode output and having control logic coupled between the output of said first inverter stage and the input of said second inverter stage, for selectively coupling said first inverter stage to said second inverter stage.

3. The bus switch integrated circuit of claim 1, wherein said first inverter stage of said gate control circuitry further comprises:

a p conductivity type MOS transistor having a source coupled to the output of said at least one diode, a gate terminal coupled to said control input terminal, and a drain coupled to the output of said first inverter stage; and an n conductivity type MOS transistor having a drain coupled to the output of said first inverter stage, a gate coupled to said control input terminal, and a source coupled to a ground voltage;

wherein the gate size ratios of said p conductivity type MOS transistor and said n conductivity type MOS transistor are adjusted such that the high input voltage required to make said first inverter stage switch from a high output voltage to a low output voltage is at a threshold level consistent with TTL level logic circuitry.

4. The bus switch integrated circuit of claim 1, wherein said at least one diode comprises a series of diodes coupled together to cause the voltage at the output of said at least one diode to be at said first predetermined voltage level.

5. The bus switch integrated circuit of claim 4, wherein said series of diodes are junction diodes.

6. The bus switch integrated circuit of claim 5, wherein each of said series of diodes comprises:

a p type substrate;

an n type well disposed within said p type substrate and having, a predetermined depth, said n type well lying at the surface of said p type substrate;

a plurality of anode stripes of a p type material disposed within and at the surface of said n type well, each of said anode stripes being contacted by an anode metallization layer and being coupled together at an anode terminal; and a plurality of cathode stripes of an n type material disposed within and at the surface of said n type well, each of said cathode stripes being contacted by a cathode metallization layer and being coupled together at a cathode terminal;

wherein said anode and cathode stripes are in parallel, are spaced apart, and are interposed such that said anode and cathode stripes alternate within said n type well.

7. The bus switch integrated circuit of claim 4, wherein each of said diodes of said gate control circuitry are Schottky diodes.

8. The bus switch integrated circuit of claim 7, wherein each of said Schottky diodes comprises:

a p type substrate;

an n type well disposed within said p type substrate and having a predetermined depth, said n type well lying at the surface of said p type substrate;

a plurality of anode contacting stripes of a metal material disposed at the surface of said n type well, each of said anode contacting stripes being coupled together at an anode terminal; and a plurality of cathode stripes of an n type material disposed within and at the surface of said n type well, each of said cathode stripes being contacted by a cathode metallization layer and being coupled together at a cathode terminal;

wherein said anode contacting stripes and said cathode stripes are in parallel, are spaced apart, and are interposed such that said anode and cathode stripes alternate within said n type well, forming a Schottky junction.

9. The bus switch integrated circuit of claim 1, wherein said driving transistor comprises an FET transistor.

10. The bus switch integrated circuit of claim 1, wherein said FET driving transistor comprises an FET transistor having a channel doped to an n conductivity type.

11. A method of providing a bus switch integrated circuit with voltage translation all on said integrated circuit, comprising:

receiving a voltage supply input voltage on said integrated circuit and producing a lower voltage at a first predetermined voltage on said integrated circuit that is less than the voltage supply input voltage;

coupling a driving transistor between a circuit input terminal and a circuit output terminal on said integrated circuit, for coupling said circuit input terminal to said circuit output terminal responsive to a gate input;

driving said gate input with said first predetermined voltage at said gate input which is less than said voltage supply input voltage, said gate input being driven by gate control circuitry on said integrated circuit that is responsive to a circuit control input; and operating said driving transistor and said gate control circuitry such that said driving transistor receives a high level voltage input at said circuit input terminal and outputs a low level voltage output at said circuit output terminal responsive to said gate control circuitry, said low level voltage output voltage being at a second predetermined voltage level which is less than said high level voltage input said step of driving said gate input with said first predetermined voltage further comprising the steps of:

coupling voltage regulation circuitry on said integrated circuit to said voltage supply input voltage, to produce a voltage regulation circuitry output on said integrated circuit which is at said first predetermined voltage level that is less than said voltage supply input;

coupling a first inverter stage on said integrated circuit to said circuit control input, said first inverter stage having an output;

providing a second inverter stage on said integrated circuit, said second inverter stage having an input and having an output coupled to said gate input;

coupling control logic on said integrated circuit between the output of said first inverter stage and the input of said second inverter stage, for selectively coupling said first inverter stage output to said second inverter stage input; and supplying said first and second inverter stages and said control logic circuit with said first predetermined voltage such that when said second inverter stage outputs a high voltage level to said gate input, said high voltage level is approximately equal to said first predetermined voltage.

12. The method of claim 11, wherein said step of coupling voltage regulation circuitry on the integrated circuit to said voltage supply voltage input and having an output which is at said first predetermined voltage level further comprises the steps of:

coupling at least one diode to said voltage supply voltage input and having an output;

providing a bias resistor coupled to said at least one diode and to a ground reference voltage to provide a bias current through said at least one diode; and choosing the value of said resistor and the size of said diode such that the voltage provided at said output of said voltage regulation circuitry is said first predetermined voltage.

13. The method of claim 12, wherein said step of coupling at least one diode further comprises the step of coupling at least two diodes coupled in series.

14. The method of claim 13, wherein the step of coupling at least two diodes further comprises coupling at least two junction diodes in series.

15. The method of claim 13, wherein the step of coupling at least two diodes further comprises coupling at least two Schottky diodes in series.

16. The method of claim 11 wherein said step of coupling a driving transistor comprises coupling an N type MOS transistor between said circuit input terminal and said circuit output terminal.

17. A bus switch integrated circuit with voltage translation, comprising:

a circuit output terminal;

a circuit input terminal;

a circuit control input terminal;

a driving transistor coupled between said circuit input terminal and said circuit output terminal to couple said circuit input terminal to said circuit output terminal, responsive to a gate input; and gate control circuitry coupled to said circuit control input terminal and having an output for driving said gate input, said gate control circuitry being coupled to a voltage supply input and operable for providing a first predetermined voltage at said gate input which is less than said voltage supply input voltage; and said gate control circuitry including:

at least one diode having an anode coupled to said voltage supply input and a cathode coupled to an output;

a first inverter stage coupled to said control input terminal, and having an output, said first inverter stage having a voltage supply input coupled to said at least one diode output;

a second inverter stage having an input coupled to said first inverter stage output and having an output coupled to said gate input, said second inverter stage having a voltage supply input coupled to said diode output; and a control logic circuit having a voltage supply input coupled to said diode output and having control logic coupled between the output of said first inverter stage and the input of said second inverter stage; and said at least one diode providing said first predetermined voltage level as the supply to said first and second inverter stages and said control logic circuit, and wherein the output of said second inverter stage is approximately equal to said first predetermined voltage;

wherein said bus switch integrated circuit is operable to receive input signals of a first voltage level at said circuit input terminal and provide output signals of a second voltage level which is a second predetermined voltage lower than said first predetermined voltage at said circuit output terminal; and wherein said first inverter stage of said gate control circuitry further comprises:

a p conductivity type MOS transistor having a source coupled to the output of said at least one diode, a gate terminal coupled to said control input terminal, and a drain coupled to the output of said first inverter stage; and an n conductivity type MOS transistor having a drain coupled to the output of said first inverter stage, a gate coupled to said control input terminal, and a source coupled to a ground voltage;

wherein the gate size ratios of said p conductivity type MOS transistor and said n conductivity type MOS transistor are adjusted such that the high input voltage required to make said first inverter stage switch from a high output voltage to a low output voltage is at a threshold level consistent with TTL level logic circuitry.

* * * * *